United States Patent [19]
Konishi et al.

[11] Patent Number: 4,943,837
[45] Date of Patent: Jul. 24, 1990

[54] THIN FILM SEMICONDUCTOR DEVICE AND METHOD OF FABRICATING THE SAME

[75] Inventors: Nobutake Konishi, Hitachiota; Kikuo Ono, Hitachi; Takaya Suzuki; Kenji Miyata, both of Katsuta, all of Japan

[73] Assignee: Hitachi, Ltd., Tokyo, Japan

[21] Appl. No.: 166,518

[22] Filed: Mar. 10, 1988

[30] Foreign Application Priority Data

Mar. 11, 1987 [JP] Japan .................. 62-54044

[51] Int. Cl.$^5$ .................... H01L 29/78; H01L 29/167
[52] U.S. Cl. ..................... 357/23.7; 357/64; 437/937; 437/21
[58] Field of Search ............... 357/23.7, 64; 437/937, 437/21

[56] References Cited
U.S. PATENT DOCUMENTS 3,849,204 11/1974 Fowler ................................ 437/937
4,772,927 9/1988 Saito et al. ........................ 357/23.7

FOREIGN PATENT DOCUMENTS 182835 10/1983 Japan .................................. 437/937
32479 2/1986 Japan .................................. 437/937

OTHER PUBLICATIONS

Pollack et al., "Hydrogen Passivation of Polysilicon MOSFET's from a Plasma Nitride Source", IEEE Electron Device Letters, vol. EDL-5, No. 11, Nov. 1984, pp. 468–470.

Primary Examiner—Rolf Hille
Assistant Examiner—Robert P. Limanek
Attorney, Agent, or Firm—Antonelli, Terry, Stout & Kraus

[57] ABSTRACT

A thin film transistor and a method of fabricating the transistor are disclosed. The gate electrode of this thin film transistor is made small in thickness so that active hydrogen for hydrogenating passivation can penetrate in a surface layer of channel region having substantially uniform thickness, through the gate electrode. Thus, hydrogenation can be effectively carried out for the thin film transistor, independently of the length of a channel formed in the transistor.

11 Claims, 5 Drawing Sheets

FIG. I
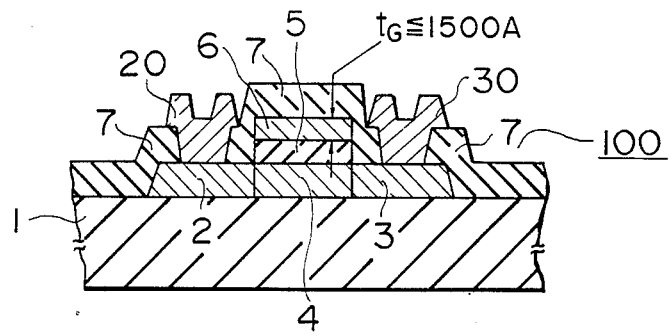
FIG. 2
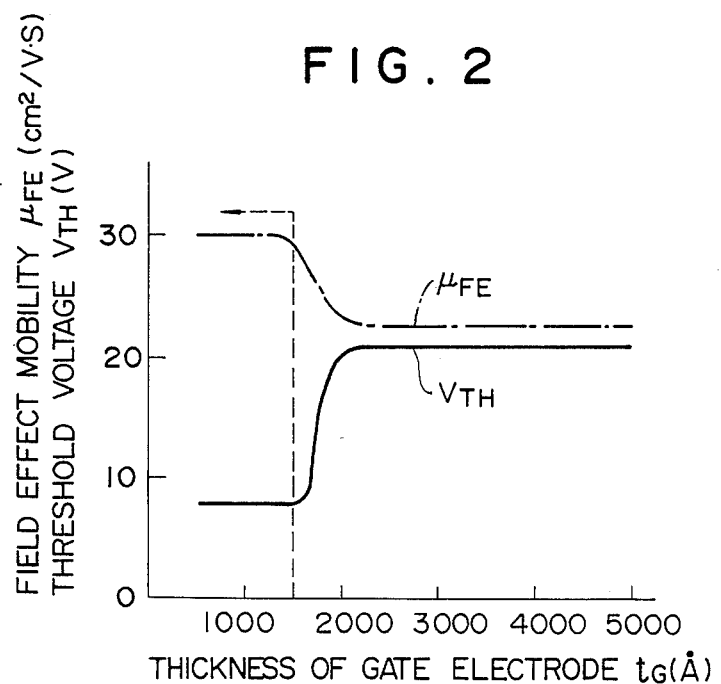

THIN FILM SEMICONDUCTOR DEVICE AND METHOD OF FABRICATING THE SAME

BACKGROUND OF THE INVENTION

The present invention relates to a thin film semiconductor device and a method of fabricating the semiconductor device, and more particularly to a thin film transistor whose characteristics can be improved effectively by hydrogenation and a method of fabricating the transistor.

Liquid crystal display devices are now widely used, since they are small in weight, thickness and power consumption. Especially, attention is paid to a liquid crystal plane display device, in which a thin film transistor (hereinafter simply referred to as "TFT") is connected to each pixel, to make possible the active matrix addressing. The performance of this display device is influenced by the characteristics of the TFT. The characteristics of TFT can be greatly improved by the hydrogenation of polycrystalline silicon which is used for making the TFT. For example, a method of diffusing hydrogen into polycrystalline silicon through an SiN film which is formed by the plasma CVD method, to hydrogenate the polycrystalline silicon, is discussed in an article (IEEE, Electron Device Lett., Vol. EDL-5, Nov. 11, 1984, pages 468 to 470). As described in the above article, metals such as molybdenum, molybdenum silicide and tungsten are impenetrable to hydrogen but polycrystalline silicon (hereinafter simply referred to as "poly-Si") is penetrable to hydrogen.

However, it has been found by the inventors' experiments that hydrogen can penetrate into only a surface layer of poly-Si having a limited thickness. Accordingly, in a case where a TFT does not have a favorable structure, it is impossible to hydrogenate the channel layer of the TFT sufficiently. This problem of a conventional TFT which has a coplanar structure as shown in FIG. 5, will be explained below in detail, with reference to FIGS. 6 and 7. It is to be noted that the channel-length dependence of threshold voltage shown in FIG. 6 and the channel-length dependence of field effect mobility shown in FIG. 7 are both found by the present inventors. Referring to FIG. 5, an undoped poly-Si layer 10 is formed on an insulating substrate 1, and an n+-source region 2 and an n+-drain region 3 are formed in the poly-Si layer 10 through ion implantation techniques. A gate insulating film 5 is formed on a channel region 4 which is not implanted with any ion, and a gate electrode 6 made of poly-Si is provided on the gate insulating film 5. Further, a phospho-silicate glass film 7 serving as a protective film, an aluminum electrode 20 serving as a source electrode, and another aluminum electrode 30 serving as a drain electrode are formed. In many TFT's having the above structure, the channel-length dependence of threshold voltage $V_{TH}$ and the channel-length dependence of film effect mobility $\mu_{FE}$ were investigated before and after plasma hydrogenation. FIGS. 6 and 7 show the results of investigation. In each of FIGS. 6 and 7, a broken line indicates the threshold voltage or field effect mobility measured before the plasma hydrogenation, and a solid line indicates the threshold voltage or field effect mobility measured after the plasma hydrogenation. As is apparent from FIGS. 6 and 7, when the channel length L of TFT is made less than or equal to 10 μm, the threshold voltage $V_{TH}$ is reduced and the field effect mobility $\mu_{FE}$ is increased by the hydrogenation. In other words, the hydrogenation is effective only for a TFT having a channel length L less than or equal to 10 μm. The reason for this will be explained below, with reference to FIG. 5. As mentioned above, hydrogen can penetrate into only a surface portion of the gate electrode 6 made of poly-Si. Accordingly, hydrogen can penetrate into a limited portion of the channel region 4 through the phospho-silicate glass layer 7 interposed between gate electrode 6 and the aluminum electrode 20 or 30. Thus, only those portions of the channel region 4 which are indicated by a length ΔL in FIG. 5, can be hydrogenated. Incidentally, the phospho-silicate glass film 7 and the gate insulating film 5 are both penetrable to hydrogen. Accordingly, the characteristics of TFT can be improved (that is, the threshold voltage $V_{TH}$ is reduced and the field effect mobility $\mu_{FE}$ is increased), as a ratio of the length ΔL of the hydrogenated portion to the total length L of the channel region 4 is larger (that is, the length L of the channel region 4 is smaller). Unlike a TFT which is used as a two-dimensional element for LSI, a poly-Si TFT used in a display device has a channel length L of about 10 μm or more in accordance with an OFF-resistance, a design rule and others. When various circuits are formed by using such TFT's, each of the circuits includes TFT's which are different in channel length L from each other. Accordingly, the characteristics of each circuit are affected by various values of channel length L. Thus, it is very difficult to actually design each circuit, and moreover it is impossible for each circuit to exhibit satisfactory characteristics.

SUMMARY OF THE INVENTION

An object of the present invention is to provide a TFT whose characteristics can be greatly improved by hydrogenation independently of the length of a channel region, and a method of fabricating the above TFT.

In order to attain the above object, according to the present invention, there is provided a TFT, in which the thickness of a gate electrode made of amorphous silicon or poly-Si is made small so that a channel region is uniformly subjected to passivation. In other words, according to the present invention, the thickness of the gate electrode is made small so that active hydrogen for hydrogenating passivation can penetrate into a surface layer of channel region having uniform thickness. In more detail in a case where a TFT has a coplanar structure or staggered structure, that is, a gate insulating film underlies a gate electrode made of poly-Si or amorphous silicon, the thickness of the gate electrode is made small so that active hydrogen can reach a channel region which lies beneath the gate insulating film, through the gate electrode. Thus, the whole surface portion of the channel region is uniformly hydrogenated, and hence the characteristics of a TFT are improved in a great degree.

BRIEF DESCRIPTION OF THE DRAWINGS

FIG. 1 is a sectional view showing the structure of an embodiment of a TFT according to the present invention.

FIG. 2 is a graph showing a relation between the thickness of a gate electrode and a threshold voltage $V_{TH}$ and a relation between the thickness of gate electrode and a field effect mobility $\mu_{FE}$, in TFT's having the structure of FIG. 1.

DESCRIPTION OF THE PREFERRED EMBODIMENTS

Now, a TFT according to the present invention and a method of fabricating the TFT will be explained below in detail, with reference to the drawings.

Figure 5:
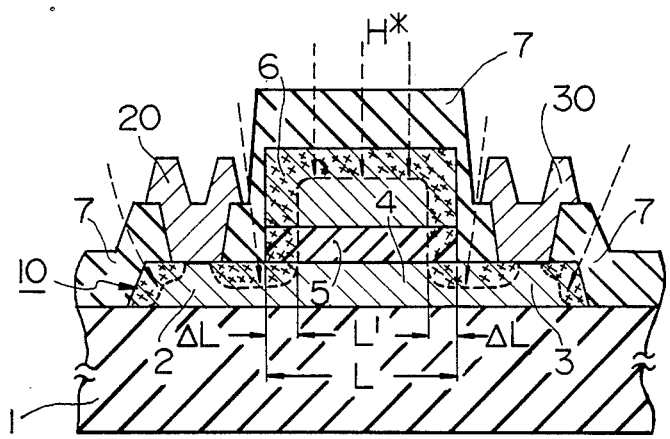
FIG. 5 is a sectional view showing the structure of a conventional TFT.
Figure 6:
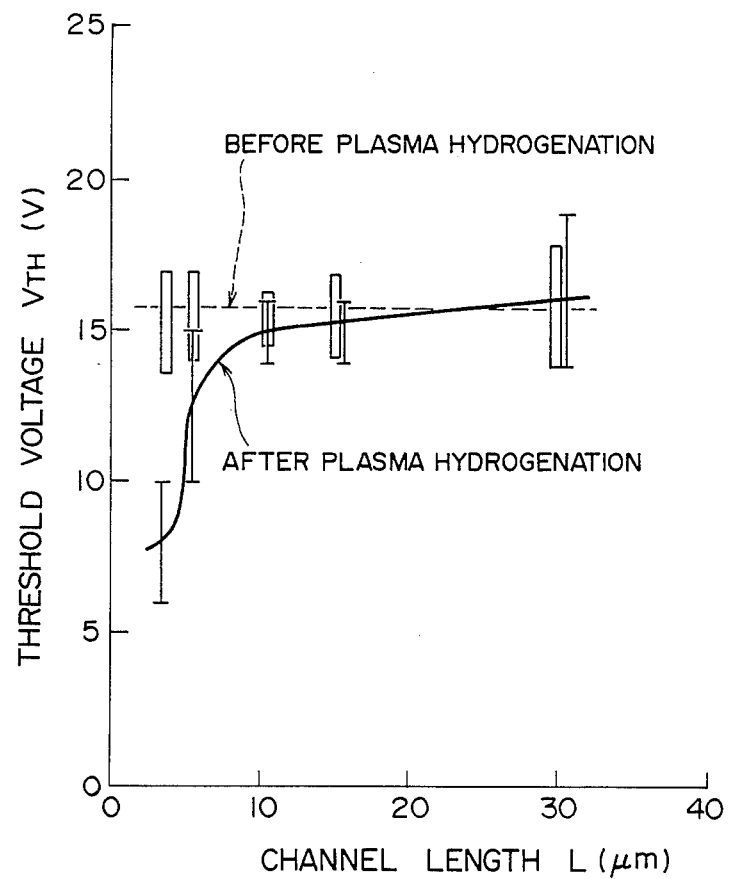
FIG. 6 is a graph showing a relation between the length of channel and a threshold voltage $V_{TH}$, in conventional TFT's having the structure of FIG. 5.
Figure 7:
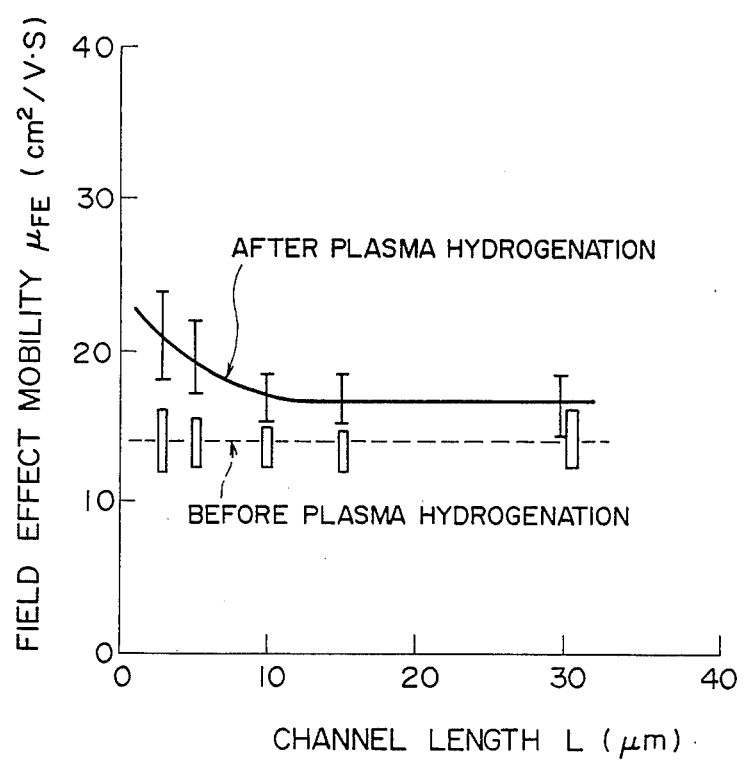
FIG. 7 is a graph showing a relation between the length of channel and a field effect mobility, in conventional TFT's having the structure of FIG. 5.

FIG. 1 shows a cross section of an embodiment of a TFT according to the present invention. In FIG. 1 the same reference numerals as in FIG. 5 designate identical or equivalent parts. Referring to FIG. 1, the present embodiment 100 includes a poly-Si layer 10 which is formed on an insulating substrate 1 made of glass, quartz, or others and has a source region 2, a drain region 3 and a channel region 4, a gate insulating film 5, a gate electrode 6 made of poly-Si, a protective phospho-silicate glass film 7, a source electrode 20, and a drain electrode 30. A characteristic feature of the present embodiment resides in that the thickness $t_G$ of the gate electrode 6 is made smaller than or equal to 1,500 Å, so that active hydrogen which is used for carrying out the hydrogenating passivation for the present embodiment, can penetrate into a surface layer of channel region having substantially uniform thickness through the gate electrode. The reason for making the thickness $t_G$ of the gate electrode 6 smaller than 1,500 Å, will be explained below in more detail, with reference to experimental results shown in FIG. 2.

FIG. 2 shows a relation between the thickness $t_G$ of a gate electrode made of poly-Si and a threshold voltage $V_{TH}$, and a relation between the thickness $t_G$ of a gate electrode made of poly-Si and a field effect mobility $\mu_{FE}$. The relations shown in FIG. 2 were obtained for TFT's which had the structure of FIG. 1 and had been exposed to a hydrogen plasma. In more detail, the TFT's were subjected to hydrogenation under conditions that the temperature of the insulating substrate was kept at 300° C., a gas pressure was kept at 100 Pa, and a high-frequency power of 300 W was supplied to the plasma. As is apparent from FIG. 2, when the thickness $t_G$ of the gate electrode becomes smaller than 2,000 Å, the field effect mobility $\mu_{FE}$ begins to increase, and the threshold voltage $V_{TH}$ begins to decrease. This is because active hydrogen which passes through the gate electrode without being absorbed, reaches the surface of the channel region 4, and is combined with a dangling bond of poly-Si in the channel region 4. As shown in FIG. 2, even when the thickness $t_G$ of the gate electrode 6 is made less than 1,000 Å, each of the field effect mobility $\mu_{FE}$ and threshold voltage $V_{TH}$ is kept unchanged. This is because, even if active hydrogen can penetrate into a deep portion of the channel region 4, a channel will be formed only in a very thin surface layer of the channel region. As can be seen from the above, when the thickness $t_G$ of the gate electrode is made too large as in a conventional TFT, the total amount of active hydrogen directed to the gate electrode is absorbed by the gate electrode, and active hydrogen cannot reach the surface of the channel region through the gate electrode. Thus, active hydrogen can pass through only the protective film which is interposed between the gate insulating film and the source or drain electrode, to reach the surface of the channel region. Thus, it is impossible to improve the characteristics of TFT having a thick gate electrode satisfactorily by hydrogenation. While, the present embodiment has such a thin gate electrode as the whole surface area of the channel region can be uniformly hydrogenated with active hydrogen having passed through the gate electrode. It is preferable to hydrogenate a surface layer of channel region having a thickness of 300 Å or more.

In a case where the thickness of the gate electrode 6 is made smaller than or equal to 1,500 Å, it is preferable to put the high-frequency power for hydrogenation in a range from 200 to 350 W. When the high-frequency power is made greater than 350 W, the interface between the gate insulating film 5 and the channel region 4 becomes rough. While, when the high-frequency power is made smaller than 200 W, it is impossible for hydrogen to penetrate into the channel region to a desired depth. The gate electrode 6 made of poly-Si can be so formed as to be substantially flat. In a case where the gate electrode has non-uniform thickness, however, it is preferable to make the maximum thickness of the gate electrode equal to 1,500 Å. Thus, the whole surface area of the channel region existing under the gate electrode 6 can be subjected to hydrogenating passivation.

Next, explanation will be made of an example of a method of fabricating the present embodiment, with reference to FIGS. 3A to 3E.

Figure 3A:
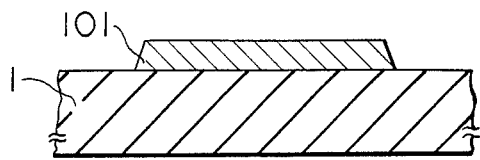
FIGS. 3A to 3E are sectional views showing the fabricating process of the embodiment of FIG. 1.
Figure 3B:
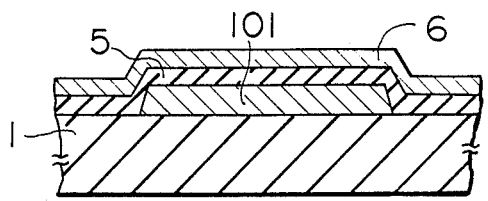
Figure 3C:
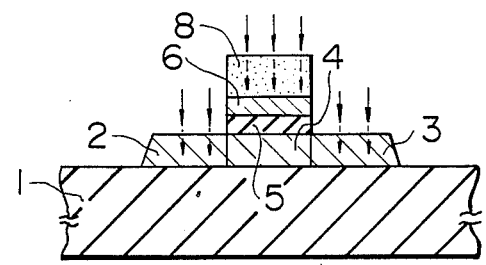
Figure 3D:
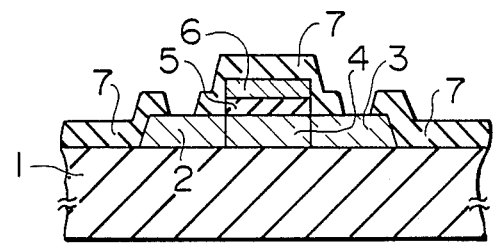
Figure 3E:
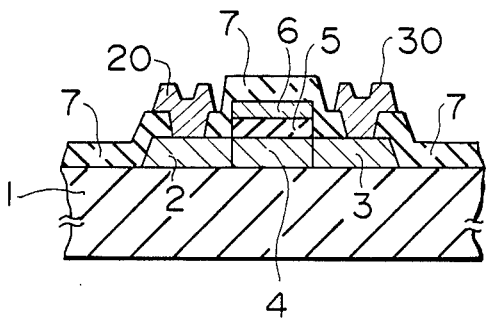

As shown in FIG. 3A, a poly-Si film 101 is first deposited on a glass substrate 1 to a thickness of about 1,500 Å by the reduced-pressure CVD method in a state that the temperature of the deposited film 101 is made lower than 600° C., and then the poly-Si film is etched through photolithographic and dry etching techniques so that a poly-Si island having a predetermined shape is left unetched. Incidentally, the film 101 may be made of amorphous silicon. Next, as shown in FIG. 3B, an SiO$_2$ film 5 serving as a gate insulating film is deposited to a thickness of about 1,000 Å by the CVD method, and then an n$^+$-polycrystalline silicon film 6 serving as a gate electrode film is deposited to a thickness of about 1,000 Å by the reduced-pressure CVD method. When the poly-Si film 6 is deposited, phosphine (PH$_3$) is used as a dopant. Next, a photoresist film 8 is formed on the poly-Si film 6 to a thickness of about 10,000 Å, and is etched through photoetching techniques so that a photoresist film having a predetermined shape is left unetched. Thereafter, as shown in FIG. 3C, a patterning operation is performed for the gate electrode film 6 and the gate insulating film 5, while using the photoresist film 8 as a mask, and then phosphorus ions accelerated by an ion accelerating voltage of 30 kV are implanted into the poly-Si island 101 at a dose rate of $5 \times 10^{15}$ cm$^{-2}$. Thereafter, the photoresist film is removed, and then annealing treatment is carried out at 600° C. Thus, a source region 2, a drain region 3 and a channel region 4 are formed in the poly-Si island 101. It is to be noted that unlike an ordinary ion implantation process, the above ion implantation is carried out without removing the photoresist film 8. This is because the gate electrode 6 of the present embodiment is made smaller in thickness than the gate electrode of a conventional TFT. That is, when the ion implantation is carried out after the photoresist film 8 has been removed and the ion accelerating voltage is made high, there is a fear that phosphorus ions may reach the channel region 4 through the gate insulating film 5. In a case where the ion accelerating voltage is made low so that phosphorus ions are blocked by the gate insulating film 5, the ion implantation can be carried out after the photoresist film has been removed, and hence it is unnecessary to dope the poly-Si film 6, serving as the gate electrode film, previously with phosphorus. Next, as shown in FIG. 3D, a phospho-silicate glass film 7 serving as a protective film or an inter-layer insulating film is formed to a thickness of 6,000 Å by the CVD method, and then through-holes for source and drain electrodes are formed in the phospho-silicate glass film 7. Finally, an aluminum film containing 2% is formed to a thickness of 6,000 to 8,000 Å by the sputtering method, and then a patterning operation is performed for the aluminum film to form a source electrode 20 and a drain electrode 30 as shown in FIG. 3E. Thereafter, in order to improve the characteristics of the present embodiment, a plasma hydrogenation is carried out. Thus, a TFT fabricating process is completed. As mentioned above, the plasma hydrogenation is carried out after the structure of the present embodiment has been formed. If the hydrogenation processing is carried out in the course of the fabricating process, hydrogen having been combined with the dangling bond of poly-Si will be released by succeeding heat treatment which uses a temperature of 400° C. or more, and thus the effect of hydrogenation will be lost. In the above fabrication method, the gate electrode 6 is made of n+-polycrystalline silicon. It is needless to say that the gate electrode 6 may be made of n+-amorphous silicon. Even when an amorphous silicon gate electrode film having been deposited is high in sheet resistance, this amorphous film is converted into a polycrystalline film by an annealing process for forming the source and drain regions, and thus the use of amorphous silicon offers no problem. Incidentally, it has been confirmed by experiments that the amorphous silicon film is converted by the annealing process into the poly-Si film.

In order to make the sheet resistance of the gate electrode made of n+-polycrystalline silicon equal to $10^4 \Omega/\square$, it is preferable to make the thickness of the gate electrode greater than or equal to 100 Å. Further, in a case where the gate electrode is kept in contact with a conductor, a contact portion of the gate electrode is coated with a metal film such as an aluminum film, to have a two-layer structure, thereby reducing the resistance of the contact portion.

According to the structure of FIG. 1 and the fabricating method of FIGS. 3A to 3E, the source and drain regions are formed by self alignment techniques, and hence an electric capacity due to the overlapping of the gate electrode and the source or drain region is scarcely produced. Accordingly, the present embodiment is suitable for use in a liquid crystal display device. Further, an excellent TFT can be obtained only by setting the thickness of gate electrode to an appropriate value. Furthermore, the characteristics of a TFT can be greatly improved by hydrogenation, independently of the dimensions of the channel region (that is, the length and width of the channel region). Additionally, since the gate electrode is made thin, the difference between the top and bottom of the topography at the upper surface of a TFT becomes small, and thus an uppermost coating layer can be readily formed.

Figure 4:
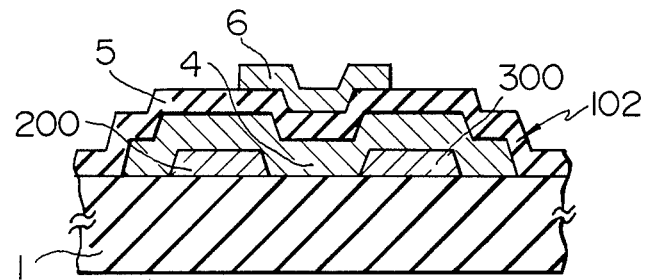
FIG. 4 is a sectional view showing the structure of another embodiment of a TFT according to the present invention.

FIG. 4 is a sectional view showing another embodiment of a TFT according to the present invention. In FIG. 4, the same reference numerals as in FIG. 1 designate identical or equivalent parts. The characteristic feature of the present embodiment resides in that a source region 200 and a drain region 300 are provided directly on a glass substrate 1, to form a staggered structure. Referring to FIG. 4, an n+-polycrystalline silicon film is deposited on the glass substrate 1, and a patterning operation is performed for this film, to form the source region 200 and the drain region 300. Thereafter, an undoped poly-Si film is deposited by the reduced-pressure CVD method, and then a patterning operation is performed to form a poly-Si island 102. Further, an SiO$_2$ film serving as a gate insulating film is deposited all over the surface by the CVD method. Thereafter, an n+-polycrystalline silicon film which is similar to the n+-polycrystalline silicon film for forming the source and drain regions and is used for forming a gate electrode 6, is deposited to the same thickness as in the embodiment of FIG. 1, and then a patterning operation is performed to form the gate electrode 6. Further, a phospho-silicate glass film (not shown) serving as a protective film is formed on the whole surface of the present embodiment, if necessary. In the present embodiment, as in the embodiment of FIG. 1, a channel is formed in that portion of a channel region which lies under the gate electrode 6 and is kept in contact with the gate insulating film 5. Accordingly, the effect of hydrogenation on the present embodiment is the same as that on the embodiment of FIG. 1.

According to the above-mentioned fabricating method and the structure of FIG. 4, all layers of a TFT can be formed without using ion implantation techniques, and thus the TFT can be formed without being damaged by ion implantation. Further, a TFT can be obtained which has source and drain regions excellent in junction characteristics.

As has been explained in the foregoing, according to the present invention, the thickness of a gate electrode made of poly-Si is made small so that active hydrogen for hydrogenation can reach a channel region through the gate electrode. Hence, the surface of the channel region can be uniformly hydrogenated, independently of the length of a channel, and thus the characteristics of a TFT can be greatly improved by hydrogenation. For example, a TFT which has a threshold voltage $V_{TH}$ of 21 V and a field effect mobility $\mu_{FE}$ of 23 cm$^2$/V·S before hydrogenation, can has a threshold voltage of 8 V and a field effect mobility of 30 cm$^2$/V·S after the hydrogenation.

We claim:

1. A thin film semiconductor device which includes a silicon layer formed on an insulating substrate and made of one of amorphous silicon and polycrystalline silicon, a gate electrode formed over the silicon layer through an insulating film and made of one of amorphous silicon and polycrystalline silicon, source and drain regions formed in the silicon layer so that the projection of the gate electrode onto the silicon layer is interposed between the source and drain regions, a channel region beneath the gate electrode and the insulating film, and source and drain electrodes kept in ohmic contact with the source and drain regions, respectively, wherein the thickness of the gate electrode is made less than or equal to 1,500 Å, whereby an active element for passivation can penetrate through the gate electrode into a surface layer of the entire channel region, which surface layer has a substantially uniform thickness, so that a passivated surface layer of the channel region, having a substantially uniform thickness for the entire channel region, can be achieved, and wherein the device further includes said passivated surface layer, having said active element for passivation therein so as to provide said passivated surface layer, having the substantially uniform thickness, for the entire channel region.

2. A thin film semiconductor device according to claim 1, wherein the active element penetrates through the gate electrode into that surface layer, of the channel region, which has a thickness of 300 Å or more.

3. A thin film semiconductor device according to claim 1, wherein the source and drain regions are formed on the insulating substrate.

4. A thin film semiconductor device according to claim 1, wherein the source and drain electrodes are formed on the silicon layer.

5. A thin film semiconductor device according to claim 1, wherein the insulating film is a silicon oxide film.

6. A thin film semiconductor device according to claim 1, wherein the thickness of the gate electrode is greater than or equal to 100 Å, and less than or equal to 1,500 Å.

7. A thin film semiconductor device according to claim 1, wherein said channel region is provided in said silicon layer, between said source and drain regions.

8. A thin film semiconductor device according to claim 1, wherein said silicon layer having the source and drain regions formed therein includes first and second parts, respectively, having the source region and the drain region formed therein, the first and second parts being spaced from each other, and wherein said channel region is formed in a further silicon layer, the further silicon layer being formed on and between the first and second parts of the silicon layer.

9. A thin film semiconductor device according to claim 1, wherein said active element for passivation is hydrogen, the passivation being a plasma hydrogenating passivation.

10. A thin film semiconductor device which includes a silicon layer formed on an insulating substrate and made of one of amorphous silicon and polycrystalline silicon, a gate electrode formed over the silicon layer through an insulating film and made of one of amorphous silicon and polycrystalline silicon, source and drain regions formed in the silicon layer so that the projection of the gate electrode onto the silicon layer is interposed between the source and drain regions, a channel region beneath the gate electrode and the insulating film, the length of the channel region beneath the gate electrode being greater than or equal to 10 μm, and source and drain electrodes kept in ohmic contact with the source and drain regions, respectively, wherein the thickness of the gate electrode is made less than or equal to 1,500 Å, whereby an active element for passivation can penetrate through the gate electrode into a surface layer of the entire channel region, which surface layer has a substantially uniform thickness, so that a passivated surface layer of the channel region, having a substantially uniform thickness for the entire channel region, can be achieved, and wherein the device further includes said passivated surface layer, having said active element for passivation therein so as to provide said passivated surface layer, having the substantially uniform thickness, for the entire channel region.

11. A thin film semiconductor device according to claim 10, wherein the channel region, having a length beneath the gate electrode greater than or equal to 10 μm, is in the silicon layer.

* * * * *